United States Patent [19]
Komatsu et al.

[11] Patent Number: 5,362,960
[45] Date of Patent: Nov. 8, 1994

[54] PHOTOELECTRIC TRANSDUCING DEVICE HAVING A SELF-EXCITING OSCILLATING MECHANISM

[75] Inventors: Kiyoshi Komatsu; Takehisa Mori; Takeshi Kudo; Hitomi Kadono, all of Kanagawa; Mitsuteru Kimura, Miyagi, all of Japan

[73] Assignee: Terumo Kabushiki Kaisha, Tokyo, Japan

[21] Appl. No.: 10,794

[22] Filed: Jan. 29, 1993

[30] Foreign Application Priority Data

Jan. 30, 1992 [JP] Japan ................... 4-015166

[51] Int. Cl.$^5$ ............................... H01J 40/14
[52] U.S. Cl. ..................... 250/214.1; 257/531
[58] Field of Search ............ 250/214 AL, 214.1; 331/117 FE; 257/531, 458, 257, 290

[56] References Cited

U.S. PATENT DOCUMENTS

| 4,734,658 | 3/1988 | Bohan, Jr. ............... | 331/117 FE |
| 5,191,302 | 3/1993 | Rossnick ................ | 331/117 FE |
| 5,204,586 | 4/1993 | Moore ................... | 250/214 AL |
| 5,227,659 | 7/1993 | Hubbard ................ | 257/531 |

FOREIGN PATENT DOCUMENTS

| 371380 | 6/1990 | European Pat. Off. . | |
| 0088421 | 7/1980 | Japan ................... | 331/117 FE |
| 63-128368 | 11/1986 | Japan . | |
| 3300549 | 12/1988 | Japan ................... | 257/531 |
| 3-62305 | of 1991 | Japan . | |
| 2151400 | 7/1985 | United Kingdom . | |

OTHER PUBLICATIONS

"RF and Noise Characterization of a Monolithically Integrated Receiver on InP", Third International Conference On Indium Phosphide And Related Materials, U. Feiste et al, Apr. 8–11, 1991, pp. 411–414.
Patent Abstracts of Japan regarding Japanese Document No. JP-63128368 (copy enclosed) dated Nov. 11, 1986.
Patent Abstracts of Japan regarding Japanese Document No. JP-3062305 (previously submitted with the Information Disclosure Statement filed Jun. 18, 1993) dated Jun. 5, 1991.
"A Miniature Opto-Electric Transformer", Mitsuteru Kimura et al, IEEE, 1991, pp. 227–232.
"Experimental Production Of Micro-Photoelectric Transducer", Mitsuteru Kimura et al, Kikai Sekkei (Machine Design), vol. 35, No. 6, pp. 49–54.

Primary Examiner—David C. Nelms
Attorney, Agent, or Firm—Burns, Doane, Swecker & Mathis

[57] ABSTRACT

A photoelectric transducer advantageously usable as an electrical energy source for driving units of work modules and sensors of a micromachine is provided. This photoelectric transducer is characterized by having a photoelectric transducing element, a self-exciting oscillating circuit, and voltage transformer and optionally further a storage mechanism formed on one substrate. It is further characterized by producing electrical power by the exposure of the photoelectric transducing element to a continuous light.

12 Claims, 3 Drawing Sheets

PHOTOELECTRIC TRANSDUCING DEVICE HAVING A SELF-EXCITING OSCILLATING MECHANISM

BACKGROUND OF THE INVENTION

1. Field of the Invention:

This invention relates to a photoelectric transducer. More particularly it relates to a photoelectric transducer of the kind for supplying energy to actuators and sensors in a micromachine body or in work modules of the micromachine.

2. Description of the Prior Art:

The work modules of a micromachine have numerous actuators and sensors packaged therein. The most popular of the methods to be conceived for supplying energy to the modules body and the component units thereof comprises a transmission of electrical power using an electric wire. The complicated distribution of numerous wires required for the supply of energy to the driving units disposed within a tiny area involves tedious work and, particularly in the case of a micromachine, imposes a restriction on the mechanical motion thereof. The fine and long wires used for the distribution have the problem of inducing heavy losses in the power being transmitted via the wires, not to mention the loss of power due to Joulean heat.

As a means to supply electrical energy to a load without the use of wire distribution, an item called a photo-electromagnetic element has been used and disclosed in JP-A-3-62,305(1991). This photoelectromagnetic element has a photoelectric transducing element, a thin film coil, and a magnetic path formed on the same substrate for the purpose of supplying the electrical power produced by the photoelectric transducing element without the use of distribution wires to the coils of such devices as the thin film magnetic head and the thin film transformer which require the electrical energy. The electrical power obtained by this element is so small that in order to heighten this electrical power to a certain level it is necessary to enlarge the area assigned to the photoelectric transducing element and increase the capacity of the photoelectric transducing element itself for generation of the electrical power. Since the element must be irradiated with light of a very high intensity, it cannot be used by itself as a sufficient power source for the micromachine. The photoelectromagnetic element thus disclosed may preferably be operated so as to produce on the secondary coil side a voltage higher than the voltage produced by the photoelectric transducing element by using the thin film transformer as a voltage transformer and the coil on the substrate as the primary coil of the voltage transformer. Since the voltage transformation requires an alternating current on the primary coil side, the electrophotomagnetic element must adopt some secondary means or measure other than the element body for the purpose of causing the light irradiating on the photoelectric transducing element to be chopped and consequently reduced into alternating flows of light. As the energy source for the micromachine, therefore, the electrophotomagnetic element cannot be easily used.

An object of this invention, therefore, is to provide a novel photoelectric transducer.

Another object of this invention is to provide a photoelectric transducer which effects conversion of a light energy into electricity by means of a photoelectric transducing element and which, therefore, can be ideally utilized as an electrical energy source for actuators and sensors in the work modules of a micromachine.

SUMMARY OF THE INVENTION

The objects described above are accomplished by a photoelectric transducer which has a photoelectric transducing element, a self-exciting oscillating circuit, and a voltage transformer disposed on one substrate.

The objects are also accomplished by a photoelectric transducer which has a photoelectric transducing element, a self-exciting oscillating circuit, a voltage transformer, and a storage mechanism disposed on one substrate.

This invention is directed to a photoelectric transducer which is characterized by producing electrical power by irradiating the photoelectric transducing element with a continuously irradiating light.

Since the photoelectric transducer of this invention has the photoelectric transducing element, the self-exciting oscillating circuit, and the voltage transformer and optionally the storage mechanism formed on one substrate as described above, it can be fabricated in an extremely small size and, therefore, can be annexed to driving units such as component work modules in a micromachine. The space required for installation can be saved and the otherwise possible loss of energy in transmission can be cut by having this photoelectric transformer closely annexed to such driving units or by having it fabricated integrally with such driving units.

DESCRIPTION OF PREFERRED EMBODIMENT

The photoelectric transducer of this invention has integrally formed on one substrate a photoelectric transducing element for converting a given light energy into electrical energy, a self-exciting oscillating circuit for transforming the DC electricity produced by the photoelectric transducing element into an alternating current, a voltage transformer for adjusting the electrical energy obtained as described above to a voltage fit for the driving units of a micromachine, and optionally further includes a storage mechanism adapted to permit temporary storage of the electrical energy and allow supply of a large amount of energy. The overall size of this photoelectric transducer is about 1 to 2 mm wide, 1 to 3 mm long, and about 0.3 to 1 mm thick.

Owing to the construction described above, the photoelectric transducer of this invention is capable of deriving the necessary electrical power from the simple continuous light without requiring the use of such a pulsed light source as has heretofore been adopted or necessitating such secondary means for chopping the light source separately of the photoelectric transducing element. Thus, it can be used as a unit for supplying an energy for a micromachine.

As the light source for the photoelectric transducer of this invention, white light such as sunlight may be used. Preferably, however, a laser beam of a wavelength fit for the characteristics of the photoelectric transducing element such as, for example, the general-purpose He-Ne laser (wavelength 0.633 μm) or GaAs laser (wavelength 0.843 μm) can be conducted through an optical fiber cable or a light waveguide to the light receiving part of the photoelectric transducing element and utilized ideally as the light energy for this photoelectric transducer.

Figure 1:
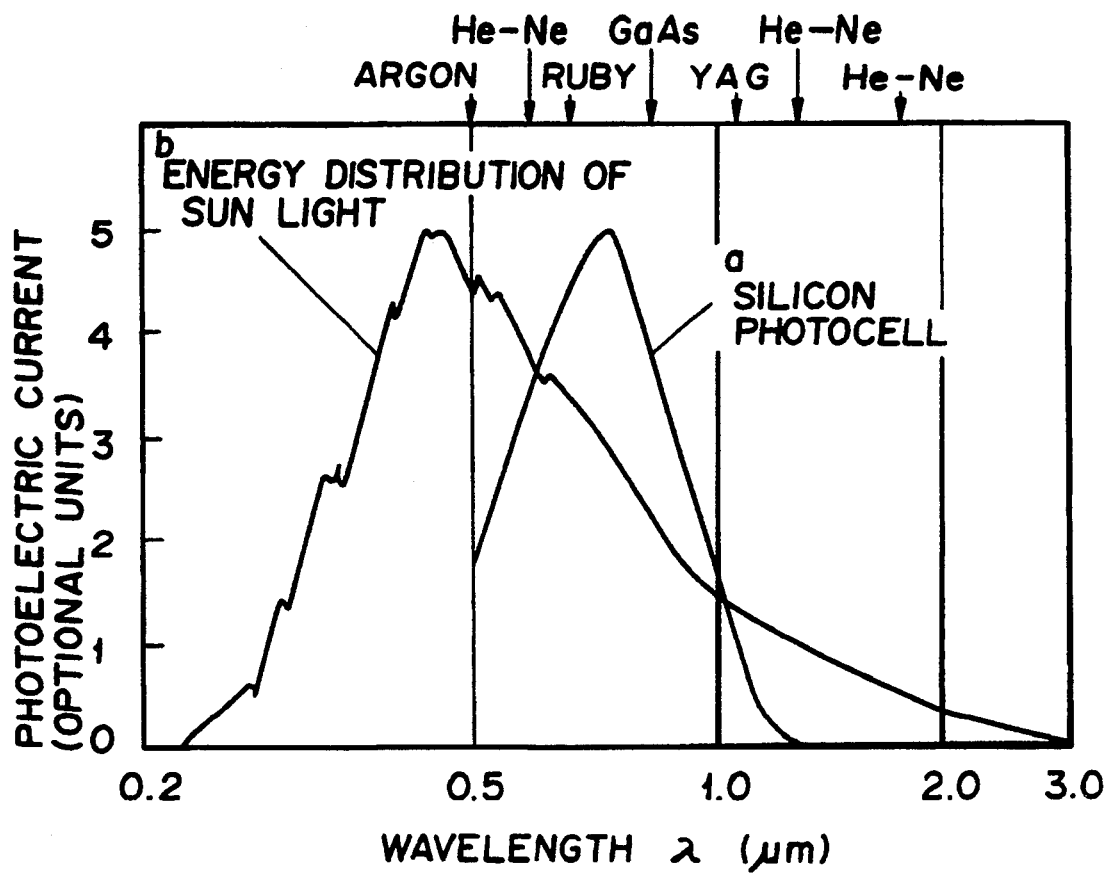
FIG. 1 is a diagram showing the dependency on wavelength of the photoelectric current generated by a photoelectric cell.

The reason for using the laser beam mentioned above is that the dependency on the wavelength of the photoelectric current of a photoelectric cell due to the pn junction of Si is such that the best efficiency of conversion is obtained at a wavelength around 0.75 μm as indicated by the curve a shown in the graph of FIG. 1. When sunlight is used as the light energy source, the energy conversion is not efficiently attained because the wavelength of sunlight having the strongest light energy does not coincide with the wavelength of the photoelectric cell having a sufficient conversion efficiency (0.75 μm) as indicated by curve b shown in FIG. 1. In contrast, by using the light of a wavelength in the proximity of 0.75 μm such as, for example, the He-Ne laser (wavelength 0.633 μm) or the GaAs laser (wavelength 0.843 μm), the conversion of the light energy to electrical energy can be attained with high efficiency.

Now, this invention will be described more specifically below with reference to an embodiment thereof. This embodiment is meant to be illustrative and not limitative of the present invention.

Figure 2:
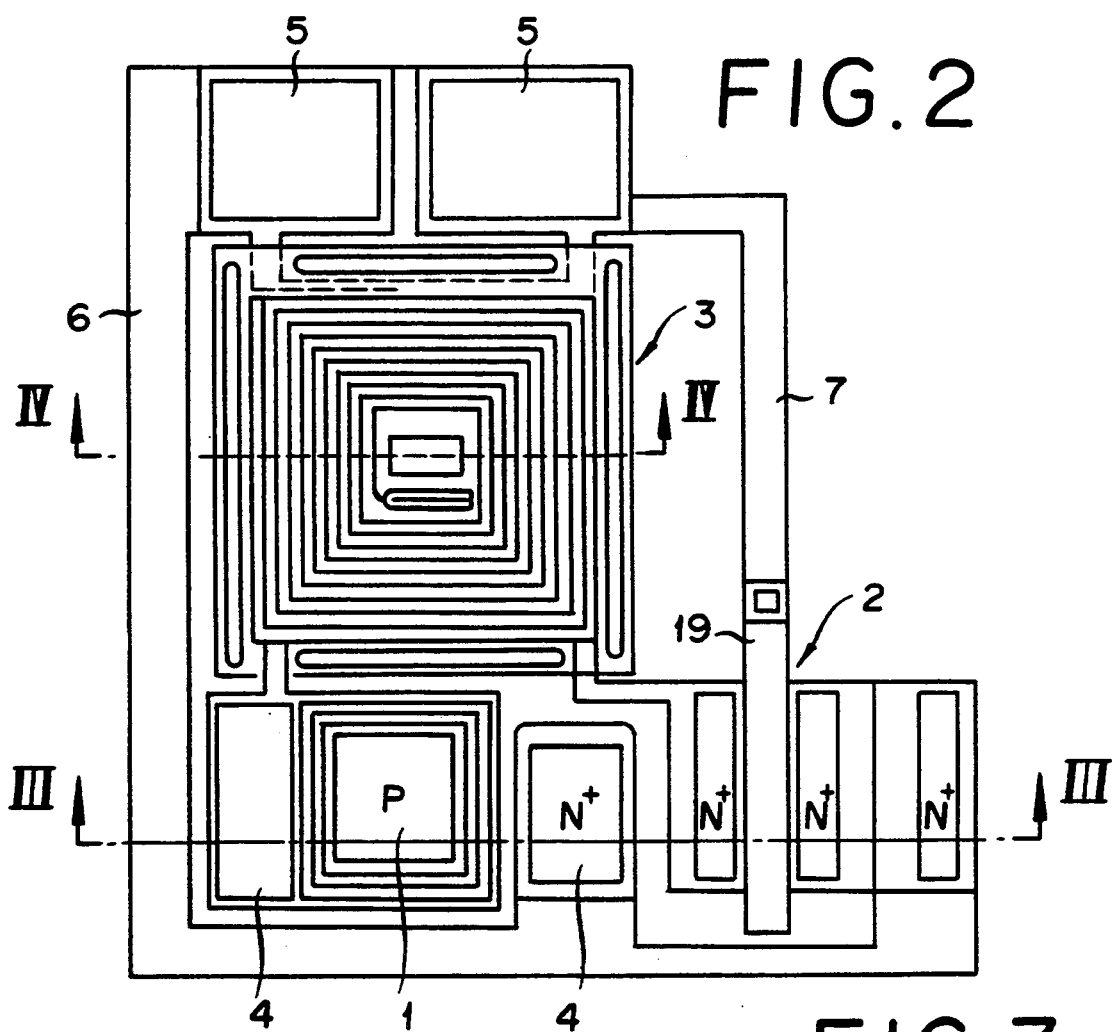
FIG. 2 is a plan view illustrating a photoelectric transducer of this invention.
Figure 3:
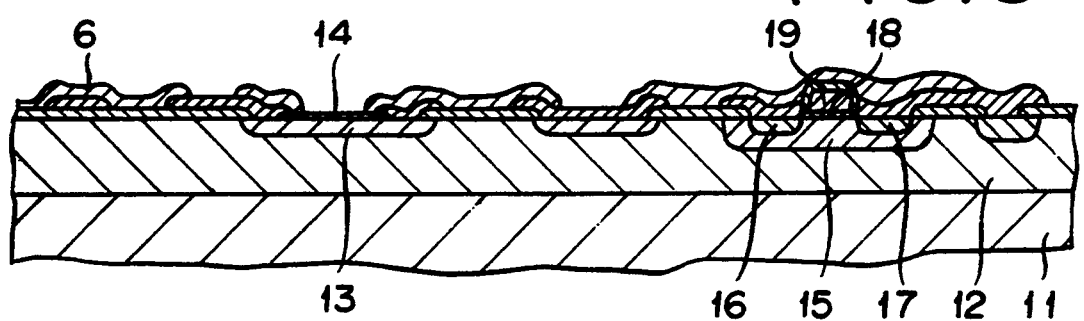
FIG. 3 is a cross section taken through FIG. 2 along the line III—III.
Figure 4:
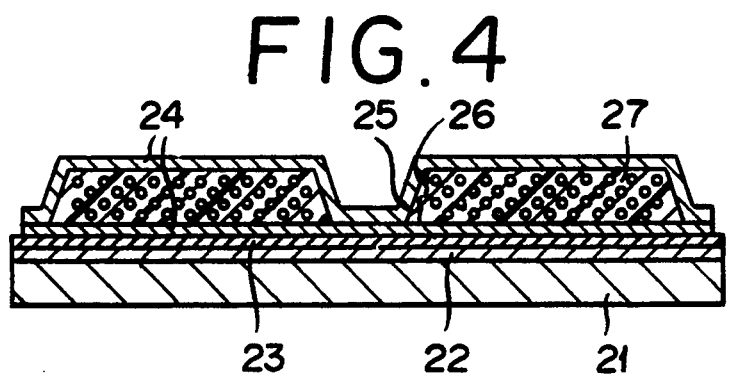
FIG. 4 is a cross section taken through FIG. 2 along the line IV—IV.

FIG. 2 is a plan view illustrating the construction of the photoelectric transducer of this invention, FIG. 3 is a cross section taken through the photoelectric cell of FIG. 2 along the line III—III, and FIG. 4 is a cross section taken through the voltage transformer of FIG. 2 along the line IV—IV.

This photoelectric transducer comprises a substrate formed by causing an n type epitaxial silicon 12 to be grown to a thickness of about 16 μm at a sheet resistance of about 15 Ω cm on a semiconductor substrate such as, for example, an n+ type silicon substrate 11 as illustrated in FIG. 3, a photoelectric cell 1, a MOS transistor 2 intended as a self-exciting oscillating circuit, and a shell-type thin film transformer 3 intended as a voltage transformer integrally formed as illustrated in FIG. 2 on the substrate, and primary side electrodes 4 and secondary side electrodes 5 provided therefor. In FIG. 2 numerals 6 and 7 are metallic wires distributed as conductors.

The light receiving part of the photoelectric cell intended as a photoelectric transducing element is obtained by thermally diffusing boron in an area of about 500 μm×500 μm, for example, on the epitaxial layer 12 thereby forming a p type layer 13 and giving rise to a pn junction for the photoelectric cell and, for the purpose of permitting efficient conversion of the incident light, superposing on the photoelectric transducing element an anti-reflecting film 14 formed of a material possessing a suitable diffractive index such as, for example, a silicon oxide film of a suitable thickness in the range of from about 0.1 to 0.3 μm, for example. The photoelectric cell may be otherwise constructed by forming pn junctions in a superposed form thereby ensuring efficient adsorption of the incident light and consequently augmenting the electromotive force or by arranging pn junctions in a series connection thereby enlarging the magnitude of the voltage to be generated.

Figure 5:
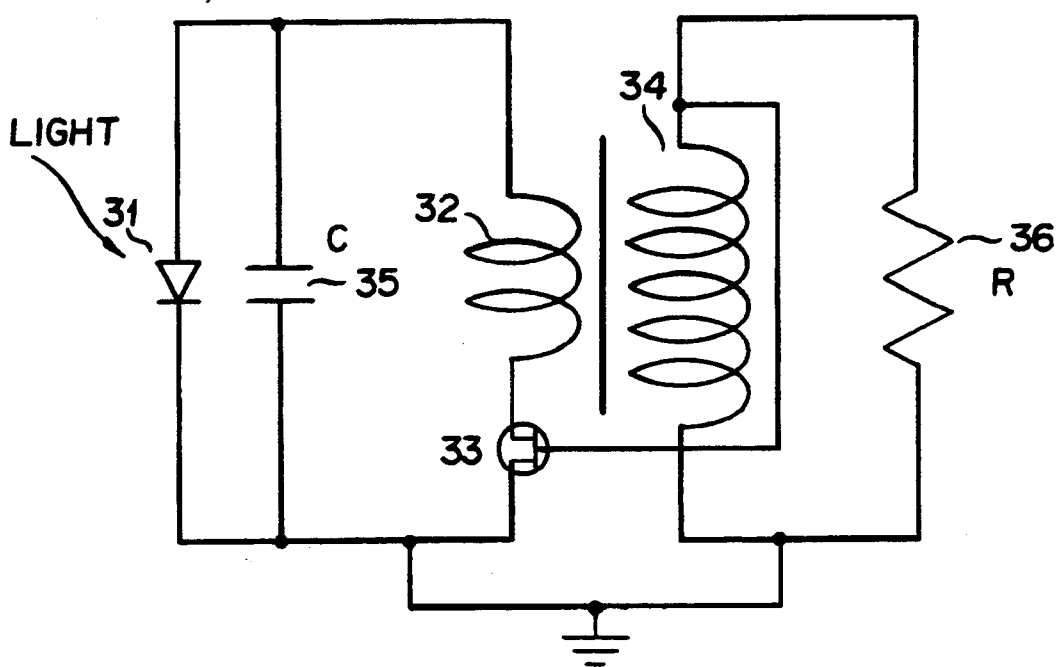
FIG. 5 is a diagram illustrating a self-exciting oscillating circuit of this invention.

The self-exciting oscillating circuit is intended to convert the DC voltage produced by the photoelectric transducing element into AC voltage. This is necessary because the transformation of voltage with the voltage transformer is required to make use of an alternating current. The circuit, therefore, has no particular restriction except for the sole requirement that it should be capable of effecting the conversion of DC to AC with high efficiency. Preferably, however, it is formed of one transistor (FET) as illustrated in the equivalent circuit of FIG. 5. This circuit, on exposure of a photoelectric transducing element 31 to light, generates an electrical current and allows electrical current to flow through a primary side coil 32 of the voltage transformer and between the source and drain of an FET 33. The flow of this electrical current through the primary side coil induces a voltage in a secondary side coil 34 and consequently a flow of electrical current through the secondary side circuit and brings about application of a voltage to the gate of the FET 33. As a result, the electrical current flowing between the source and drain of the FET 33 is shut off to stop the flow of electrical current to the primary side coil and electrical current to the secondary side coil 34 and also the application of voltage to the gate of the FET 33. Thus, the conversion of DC to AC is accomplished by producing a switching motion of the FET in the manner described above, namely by turning ON and OFF the electrical current flowing between the source and drain of the FET connected to the primary side circuit thereby feeding back the voltage generated on the secondary side to the gate of the FET and repeating this procedure. In the arrangement described above, the primary side coil 32 and a capacitor 35 jointly form a resonance circuit. Incidentally, this capacitor 35 forms a parasitic capacitance between the windings of the coil. The FET is designed suitably so that the frequency of the resonance generated jointly by the coil and the capacitor fits the switching motion of the FET.

With reference to FIG. 2, the MOS transistor 2 which is destined to form the FET for the self-exciting oscillating circuit mentioned above is formed by injecting boron ion by the ion implantation technique into the epitaxial layer 12, thermally diffusing the implanted boron ion thereby forming a P-well region 15, photolithographically patterning on the P-well region 15 an n+ layer destined to form a source 16 and a drain 17 of the MOS transistor 2, and injecting phosphorus or arsenic ion by the ion implantation technique and thermally diffusing the implanted ion and the MOS transistor 2 is formed with a gate oxide film 18 and a polysilicon gate 19 as illustrated in FIG. 3.

The voltage transformer is intended to elevate the voltage produced by the photoelectric transducing element to the specific voltage which is required by the driving units of the micromachine. A voltage transformer which is formed by winding a primary coil and a secondary coil on an ordinary core may be used satisfactorily. In the present embodiment, however, for the purpose of enabling the voltage transformer to be integrally formed on one substrate in conjunction with the photoelectric transducing element and the self-exciting oscillating circuit, the shell-type thin film voltage transformer which is obtained by further forming a silicon oxide film on the epitaxial layer 22 overlying the silicon substrate 21, winding coils on the silicon oxide film, and enclosing the coils with a magnetic thin film core 24 after the fashion of a doughnut as illustrated in FIG. 4 is advantageously used because it can be fabricated in an extremely small size. In this voltage transformer, the magnetic thin film core 24 is produced by molding such a material as ferrite or permalloy which has a high permeability in the form of a thin film about 1 to 100 μm in thickness, further superposing thereon a thin film of such a metallic material as Al or Cu which has a small resistance, and photolithographically patterning this thin film thereby giving rise to a primary coil 25 and a secondary coil 26. For the purpose of mutual insulation of these coils, an insulating member 27 such as, for example, a polyimide photo-sensitive or an oxide film is interposed between the coils during the formation of the metallic thin film. Then, the tiny shell-type thin film voltage transformer is completed by having the coils wrapped in with a magnetic thin film core made of ferrite or permalloy after the fashion of a doughnut. The number of windings of these coils may be suitably decided by due consideration of the extent of voltage transformation. In the case of the present embodiment, for example, the ratio of the numbers of windings of the primary coil: secondary coil may be preferably fixed at 1:8 where the voltage obtained on the primary side is about 0.6 V and the voltage on the secondary side accordingly is fixed at 5 V. The size of this shell-type thin film voltage transformer is in the range of from about 0.5 mm×0.5 mm to about 1.5 mm×1.5 mm.

The overall size of the photoelectric transducer which is obtained as described above is about 1 mm×1 mm ×0.5 mm.

The photoelectric transducer of this invention, when necessary, is able to produce the large electrical power required to drive work modules of a large work load by being further provided with a storage mechanism.

Figure 6:
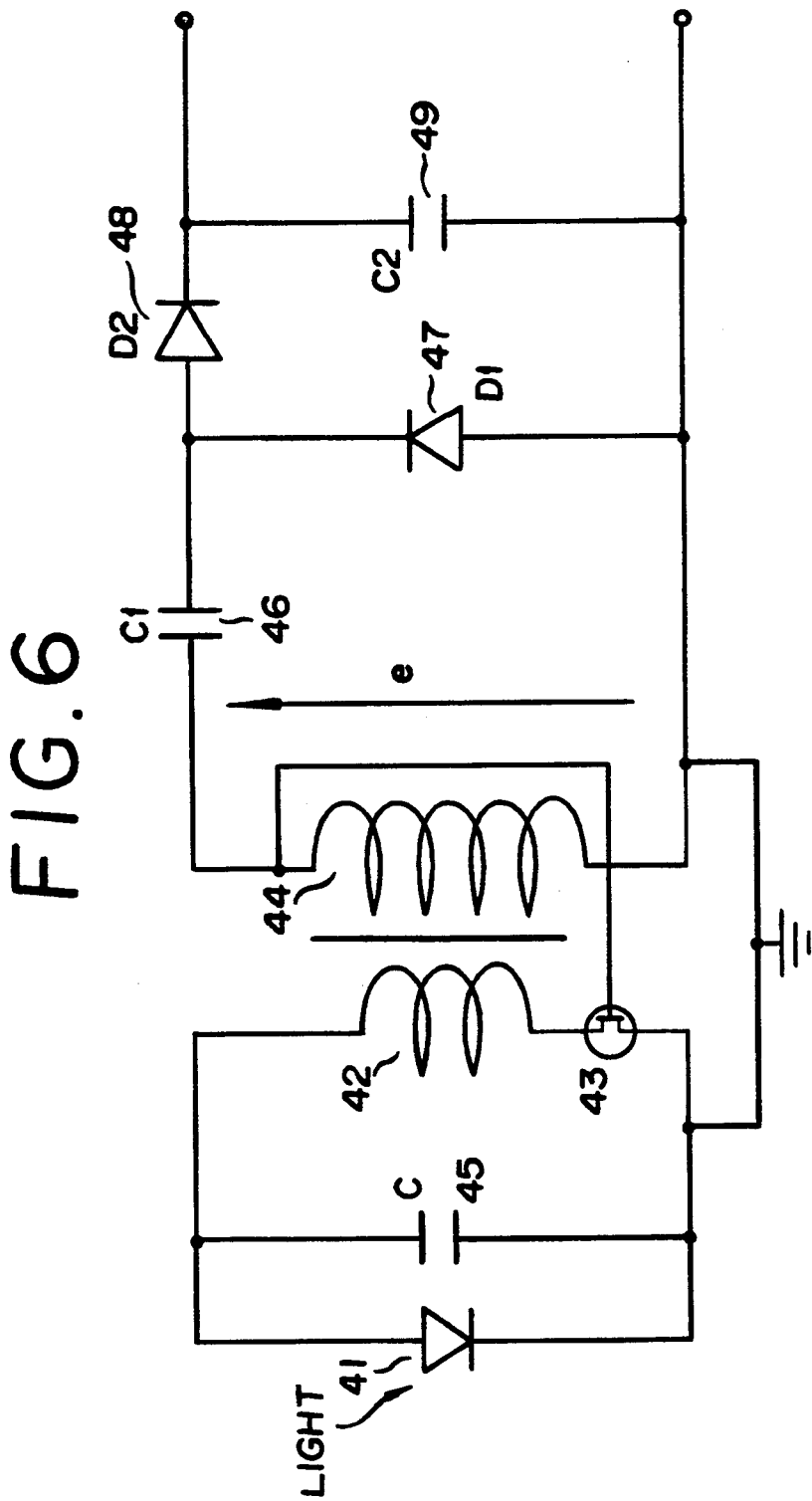
FIG. 6 is a diagram illustrating a self-exciting oscillating circuit of this invention provided with a storage mechanism.

This storage mechanism is realized by a voltage doubler circuit constructed as illustrated in FIG. 6, for example. This circuit is adapted so that a capacitor 46 is charged via a diode 47 where the voltage e<0 as illustrated in FIG. 6 and the electrical current flows through a diode 48 in the direction of the output where e>0. A capacitor 49 is capable of attenuating the ripple component contained in the output voltage, accumulating the charge, and supplying a large electrical energy instantaneously to the work modules of a large work load. In FIG. 6, numeral 41 is a photoelectric cell, 42 is a primary side coil, 43 is an FET, 44 is a secondary coil, and 45 is a capacitor, which take part in the formation of the self-exciting oscillating circuit mentioned above. In the actual fabrication, the capacitors 46 and 49 are each formed with a p+ silicon having boron diffused in a high concentration in the epitaxial n type layer. On their surfaces, a dielectric material roughly 0.01 to 0.1 μm is formed of an insulating material such as, for example silicon oxide film, silicon nitride film, or preferably Teflon of a high dielectric constant. On the dielectric material, an electroconductive film such as of Al or Cu is formed in a thickness of about 0.1 μm for the purpose of being used as another electrode of the capacitor.

Rectifying diodes 47 and 48 are formed by injecting boron into the epitaxial n type layer in an amount of about $1 \times 10^{16}$ cm$^{-3}$ by the ion implantation method forming an anode of p type silicon, further injecting arsenic into the p type silicon in a high concentration of about $1 \times 10^{20}$ cm$^{-3}$ by the ion implantation method, and forming a cathode. On the electrodes, electrical wires of Al are distributed to interconnect the capacitor, voltage transformer, and other components. Thus, the photoelectric transducer provided with a storage mechanism can be integrally formed.

What is claimed is:

1. A photoelectric transducing device comprising:
   a photoelectric transducing element for converting an irradiated continuous light to a direct electric current;
   a self-exciting oscillating mechanism for receiving said direct electric current; and
   a thin film voltage transformer including a coil and a condenser for generating a resonance frequency matched to a switching action of a field-effect transistor, said photoelectric transducing element, said self-exciting oscillating mechanism and said thin film voltage transformer being formed on one substrate.

2. A photoelectric transducing device according to claim 1, wherein said photoelectric transducing element, said self-exciting oscillating circuit, and said voltage transformer are integrally formed on an epitaxial layer.

3. A photoelectric transducing device according to claim 2, wherein a light receiving part of said photoelectric transducing element is obtained by forming a p type layer on said epitaxial layer thereby giving rise to a pn junction for a photoelectric cell and forming an anti-reflection preventing film on the surface of said junction.

4. A photoelectric transducing device according to claim 2, wherein the FET of said self-exciting oscillating circuit is obtained by patterning in a P-well region inserted in said epitaxial layer an n+ layer destined to form a source and a drain of a MOS transistor, injecting phosphorus by ion implantation or thermally diffusing arsenic, and forming a gate oxide film and a polysilicon gate.

5. A photoelectric transducing device according to claim 2, wherein said transducer is obtained by superposing a coil layer on a silicon oxide film overlying said epitaxial layer and covering said coil layer with a magnetic thin film core.

6. A photoelectric transducing device according to claim 1, further comprising:
   a storage mechanism, provided on a secondary output side of said thin film voltage transformer, and formed on said one substrate, for increasing power output of the photoelectric transducing device.

7. A photoelectric transducing device comprising:
   a photoelectric transducing element for converting an irradiated continuous light to a direct electric current;
   a self-exciting oscillating mechanism for receiving said direct electric current;
   a thin film voltage transformer having a coil and a condenser for generating a resonance frequency matched to a switching action of a field-effect transistor; and
   a storage mechanism for increasing power output of the photoelectric transducing device used to drive a load, said photoelectric transducing element, said self-exciting oscillating mechanism, said thin film voltage transformer and said storage mechanism being formed on one substrate.

8. A photoelectric transducing device according to claim 7, wherein said photoelectric transducing element, said self-exciting oscillating circuit, said voltage transformer, and said storage mechanism are integrally formed on an epitaxial layer.

9. A photoelectric transducing device according to claim 8, wherein a light receiving part of said photoelectric transducing element is obtained by forming a p type layer on said epitaxial layer thereby giving rise to a pn junction for a photoelectric cell and forming an anti-reflection preventing film on the surface of said junction.

10. A photoelectric transducing device according to claim 8, wherein the FET of said self-exciting oscillating circuit is obtained by patterning in a P-well region inserted in said epitaxial layer an n+ layer destined to form a source and a drain of a MOS transistor, injecting phosphorus by ion implantation or thermally diffusing arsenic, and forming a gate oxide film and a polysilicon gate.

11. A photoelectric transducing device according to claim 8, wherein said transducer is obtained by superposing a coil layer on a silicon oxide film overlying said epitaxial layer and covering said coil layer with a magnetic thin film core.

12. A photoelectric transducing device according to claim 8, wherein said storage mechanism is obtained by forming a dielectric layer on the surface of a p+ silicon layer superposed on said epitaxial n type layer and utilizing a conductive layer formed on said dielectric as one of electrodes.

* * * * *